United States Patent
Kishi et al.

(10) Patent No.: US 11,372,022 B2
(45) Date of Patent: Jun. 28, 2022

(54) ELECTRICAL CONTACTOR AND ELECTRICAL CONNECTING APPARATUS

(71) Applicant: KABUSHIKI KAISHA NIHON MICRONICS, Tokyo (JP)

(72) Inventors: Yasutaka Kishi, Tokyo (JP); Masahiro Wakazawa, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 16/940,760

(22) Filed: Jul. 28, 2020

(65) Prior Publication Data
US 2021/0041480 A1  Feb. 11, 2021

(30) Foreign Application Priority Data

Aug. 9, 2019 (JP) .............................. JP2019-147759

(51) Int. Cl.
*G01R 1/067* (2006.01)

(52) U.S. Cl.
CPC ..... *G01R 1/06716* (2013.01); *G01R 1/06738* (2013.01)

(58) Field of Classification Search
CPC ............ G01R 1/06716; G01R 1/06738; G01R 1/06727; G01R 1/0416; G01R 1/06733; G01R 1/07342; G01R 1/067; G01R 31/2886; G01R 31/2887; G01R 31/2889; G01R 31/2891
See application file for complete search history.

(56) References Cited

U.S. PATENT DOCUMENTS

| 5,286,208 A * | 2/1994 | Matsuoka ............ H01R 13/112 439/72 |
| 2007/0216433 A1 | 9/2007 | Miura et al. |
| 2008/0197869 A1 | 8/2008 | Miyagi et al. |

(Continued)

FOREIGN PATENT DOCUMENTS

| CN | 100343676 C | 10/2007 |
| JP | 2006189370 A | 7/2006 |

(Continued)

OTHER PUBLICATIONS

Search Report issued in corresponding Singapore Patent Appln. No. 10202006953Q dated Sep. 10, 2021.

(Continued)

*Primary Examiner* — Lee E Rodak
(74) *Attorney, Agent, or Firm* — Bacon & Thomas, PLLC

(57) ABSTRACT

An electrical contactor includes: an installing portion; a base end portion extending continuously toward the installing portion; a plurality of arm portions extending from the base end portion in a longitudinal direction; a coupling portion coupled to the tip of each of the arm portions; a pedestal portion provided continuously toward the coupling portion; and a contact portion provided at a lower end of the pedestal portion, wherein each of the plurality of arm portions elastically supports the contact portion in contact with a first contact target, and a curved portion is provided on the coupling portion side or the base end portion side of a closest-to-contact-portion arm portion that is the closest to the contact portion among the plurality of arm portions.

6 Claims, 8 Drawing Sheets

(56) References Cited

U.S. PATENT DOCUMENTS

| | | | | |
|---|---|---|---|---|
| 2009/0009201 A1* | 1/2009 | Miyagi | ............ | G01R 1/06733 |
| | | | | 324/750.16 |
| 2009/0160473 A1* | 6/2009 | Fukami | ............ | G01R 1/06727 |
| | | | | 324/754.07 |
| 2009/0230982 A1 | 9/2009 | Hirakawa | | |
| 2010/0219854 A1* | 9/2010 | Kuniyoshi | ......... | G01R 31/2891 |
| | | | | 324/750.16 |

FOREIGN PATENT DOCUMENTS

| | | |
|---|---|---|
| JP | 2009-229410 A | 10/2009 |
| JP | 2009229410 A | 10/2009 |
| JP | 2013072706 A | 4/2013 |
| KR | 10-1019554 B1 | 3/2011 |
| TW | 200624815 A | 7/2006 |

OTHER PUBLICATIONS

First office action issued in corresponding Taiwan Patent Appln. No. 109124891 dated Jun. 18, 2021.
Search Report related to Office Action issued in corresponding Taiwan Patent Appln. No. 109124891 dated Jan. 25, 2022.
Office Action issued in corresponding Korean Patent Appln. No. 10-2020-0095082 dated Feb. 22, 2022.

* cited by examiner

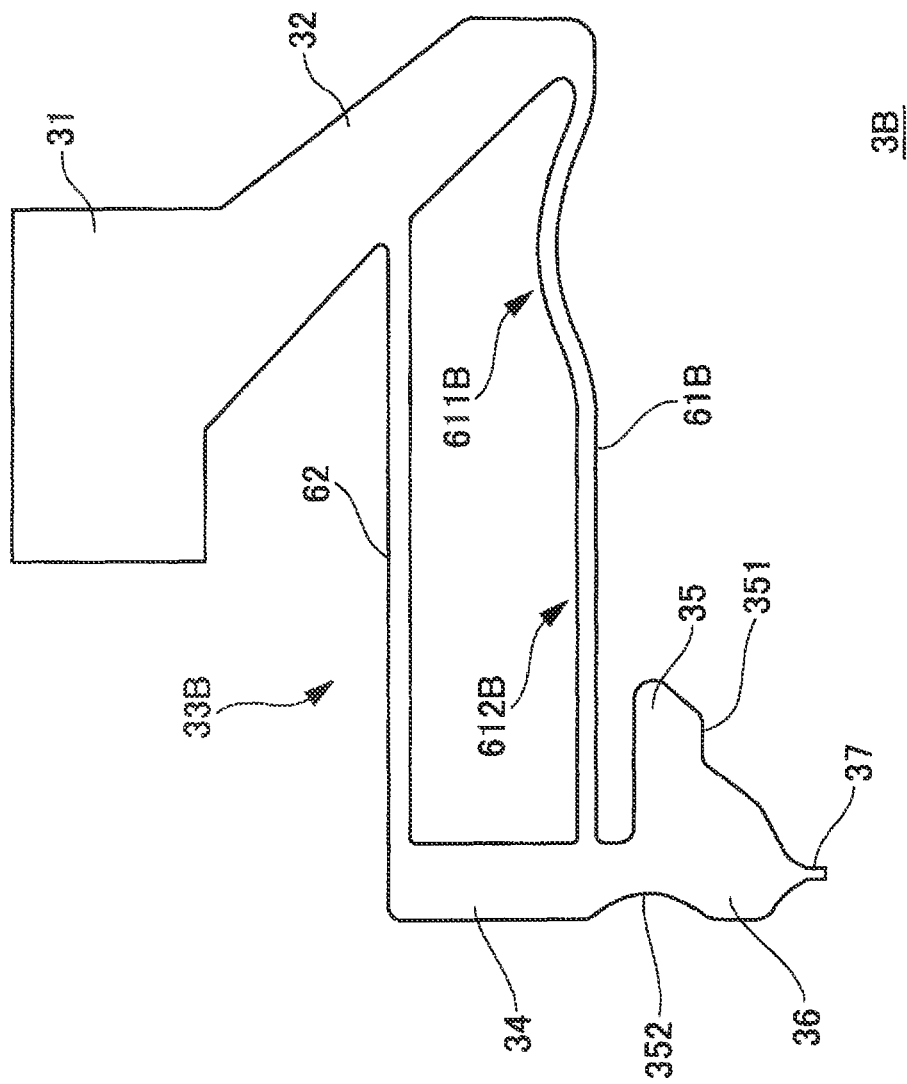

ELECTRICAL CONTACTOR AND ELECTRICAL CONNECTING APPARATUS

CROSS-REFERENCE TO RELATED APPLICATIONS

The present application claims, under 35 USC 119, priority of Japanese Patent Application No. 2019-147759 filed on Aug. 9, 2019.

TECHNICAL FIELD

The present disclosure relates to an electrical contactor and an electrical connecting apparatus, and is applicable to, for example, an electrical contactor and an electrical connecting apparatus used for electrical inspection of a semiconductor integrated circuit and the like formed on a semiconductor wafer.

BACKGROUND ART

The electrical inspection of each semiconductor integrated circuit (object to be inspected) formed on a semiconductor wafer uses an inspection device (a tester) in which an electrical connecting apparatus such as a probe card having a plurality of probes (hereinafter also referred to as "electrical contactors"), is installed onto a test header.

A plurality of probes are attached to the probe card such that the tips of the respective probes protrude from a lower surface of the probe card. When an object to be inspected is pressed against the probe card, the tip of each probe and an electrode terminal corresponding to the object to be inspected come into electrical contact with each other. During the inspection, an electrical signal from the inspection device is supplied to each object to be inspected via each probe, and then a signal from each object to be inspected is taken in by the inspection device side via each probe, thereby conducting the electrical inspection of each object to be inspected.

In recent years, along with higher density, higher integration, and the like of a semiconductor integrated circuit, the diameter of the electrode terminal of the semiconductor integrated circuit has become smaller, and the pitch of the intervals between electrode terminals has become narrower. In this regard, a cantilever probe is used to ensure electrical contact with the electrode terminals with a smaller diameter and narrower pitch.

For example, Patent Literature 1 discloses a contactor that includes an installing portion, two arm portions extending in the left and right directions from the installing portion, and a pedestal portion coupling the two arm portions on the tip sides of the two arm portions, wherein the contactor has a contact portion that comes into electrical contact with an electrode terminal at a lower end of the pedestal portion. The rear ends of the two arm portions are supported by the installing portion, and when the contact portion of the probe and the electrode terminal of the object to be inspected are in electrical contact with each other, the two arm portions each function as a portion that elastically supports the contact portion in order to suppress the contact load between the contact portion and the electrode terminal. To ensure the positioning of the contact portion with respect to the electrode terminal of the object to be inspected, the arm portion that is the closer of the two arm portions to the contact portion (a lower arm portion 34 in FIG. 1 of Patent Literature 1), is formed linearly.

In such a cantilever probe, the installing portion and the contact portion are spaced apart from each other in the left and right directions, and further, the arm portions act elastically in the above-mentioned way when the contact portion of the probe and the electrode terminal of the object to be inspected come into electrical contact with each other. Thus, when the contact portion and the electrode terminal come into electrical contact with each other, the position of the contact portion of the probe moves in an arc around the installing portion as the center. Alternatively, when overdrive is applied, the contact portion of the probe in contact with the electrode terminal scrubs the surface of the electrode terminal. Furthermore, to lessen damage or the like of the surface of the electrode terminal, it is necessary to appropriately adjust the needle pressure (the pressure at the time of contact) of the contact portion against the electrode terminal.

Conventionally, the amount of movement, the amount of scrubbing, the needle pressure, and the like of the contact portion of the probe as mentioned above are adjusted by finely adjusting the thickness (the length in the vertical direction) of the arm portion of the probe, the way it is curved, and the like.

CITATION LIST

Patent Literature 1: Japanese Laid-Open Patent Application Publication. No. 2009-229410

SUMMARY OF INVENTION

Technical Problem

In order to improve electrical inspection of the object to be inspected and inspect the object to be inspected with high accuracy, it is required to make the conduction characteristics of the electrical signal flowing through the probe better. For this reason, it is conceivable to increase, for example, the thickness (the length in the vertical direction) of the arm portion of the probe, or to reduce the resistance value thereof. However, when increasing the thickness of the arm portion of the probe, the arm portion is less likely to experience elastic deformation (for example, bending), which it is feared may increase the amount of movement and the amount of scrubbing of the contact portion of the probe.

In addition, as the probe has been progressively reduced in size, the length of the arm portion of the probe in the left and right directions becomes shorter, causing a problem of difficulty in controlling (adjusting) the amount of movement of the contact portion of the probe.

Thus, there is a need for an electrical contactor and an electrical connecting apparatus that can improve the electrical inspection of an object to be inspected by making the conduction characteristics of the electrical signal flowing through an electrical contactor better.

Solution to Problem

To solve such problems, an electrical contactor according to a first aspect of the present disclosure is characterized by including: an installing portion; a base end portion extending continuously toward the installing portion; a plurality of arm portions extending from the base end portion in a longitudinal direction; a coupling portion coupled to the tip of each of the arm portions; a pedestal portion provided continuously toward the coupling portion; and a contact portion provided at a lower end of the pedestal portion, wherein each of the plurality of arm portions elastically supports the contact portion in contact with a first contact target, and a curved portion is provided on the coupling portion side or the base end portion side of a closest-to-contact-portion arm portion that is the closest to the contact portion among the plurality of arm portions.

An electrical connecting apparatus according to a second aspect of the present disclosure includes a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to the first aspect of the present disclosure.

Advantageous Effects of Invention

According to the present disclosure, the electrical inspection of an object to be inspected can be improved by making the conduction characteristics of the electrical signal flowing through an electrical contactor better.

BRIEF DESCRIPTION OF DRAWINGS

FIG. 8 is a configuration diagram showing a configuration of an electrical contactor according to a modified embodiment (Part 2),

DESCRIPTION OF EMBODIMENTS (A) Main Embodiment

Figure 2:
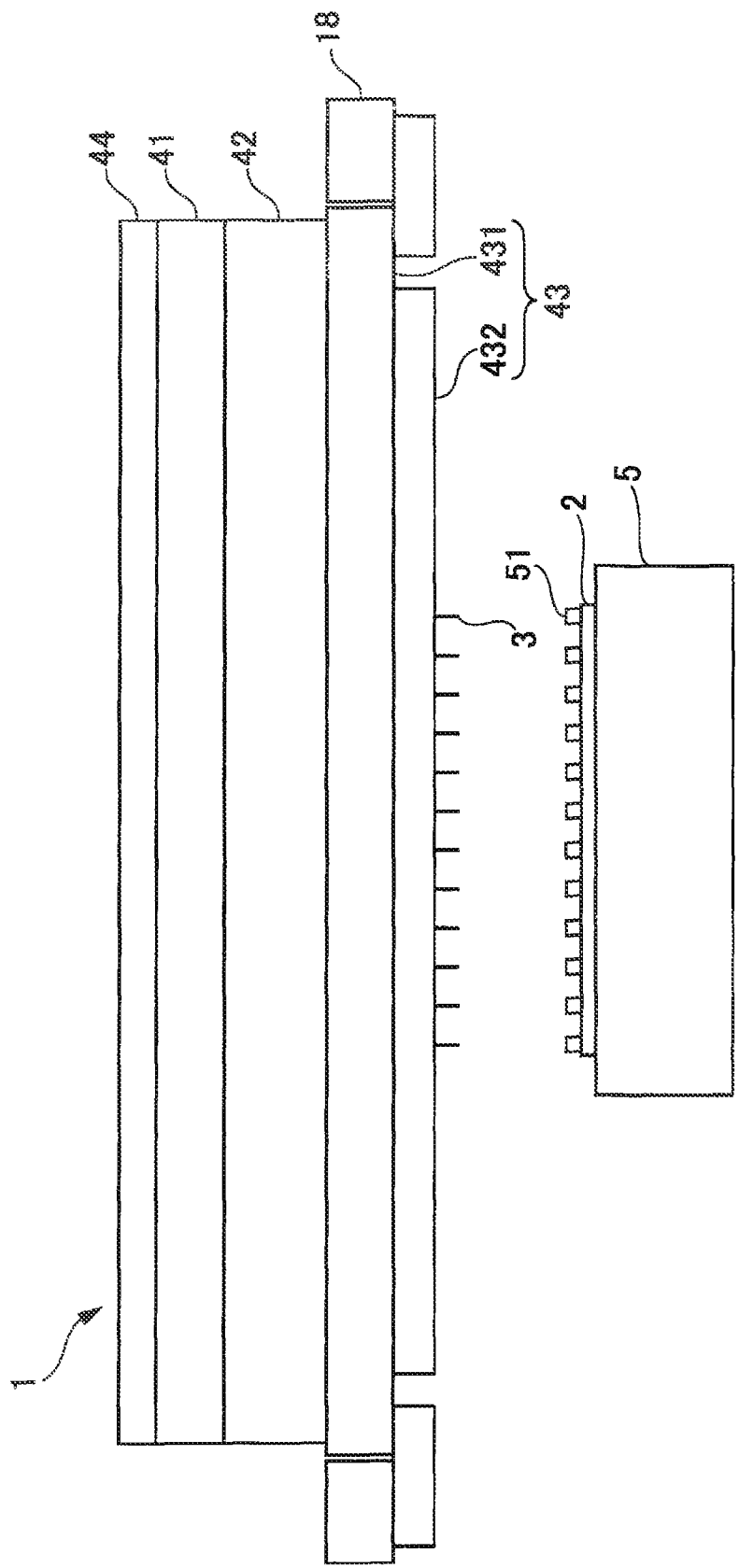
FIG. 2 is a configuration diagram showing a configuration of an electrical connecting apparatus according to an embodiment.

In the following, a main embodiment of an electrical contactor and an electrical connecting apparatus according to the present disclosure will be described in detail with reference to the drawings.
(A-1) Configuration of Embodiment
(A-1-1) Electrical Connecting Apparatus FIG. 2 is a configuration diagram showing a configuration of an electrical connecting apparatus according to the embodiment. Although FIG. 2 shows main components of an electrical connecting apparatus 1, the electrical connecting apparatus 1 is not limited to these components, and in fact includes other components not shown in FIG. 2. Hereinafter, reference is made to "upper" and "lower" by focusing on the vertical direction in FIG. 2.

In FIG. 2, the electrical connecting apparatus 1 according to the embodiment includes: a flat plate-shaped support member 44; a flat plate-shaped wiring board 41 held on a lower surface of the support member 44; an electrical connection unit 42 electrically connected to the wiring board 41; and a probe substrate electrically connected to the electrical connection unit 42 and equipped with a plurality of electrical contactors (hereinafter also referred to as "probes") 3, each electrical contactor being electrically connected to an electrode terminal 51 of the object 2 to be inspected.

The electrical connecting apparatus 1 uses a number of fixing members (for example, screw members, such as bolts) when assembling the support member 44, the wiring board 41, the electrical connection unit 42, the probe substrate 43, and the like, but the illustration of these fixing members is omitted in FIG. 2.

The electrical connecting apparatus 1 targets, for example, a semiconductor integrated circuit or the like formed on a semiconductor wafer, as an object 2 to be inspected, and performs electrical inspection on the object 2 to be inspected. Specifically, the object 2 to be inspected is pressed toward the probe substrate 43, so that the tips of the respective electrical contactors 3 on the probe substrate 43 and the electrode terminals 51 on the object 2 to be inspected come into electrical contact with each other. Then, during the inspection, an electrical signal from an inspection device (tester) (not shown) is supplied to each of the electrode terminals 51 of the object 2 to be inspected via each electrical contactor 3, and further, an electrical signal from the electrode terminal 51 of the object 2 to be inspected body is supplied to the inspection device via each of the electrical contactors 3. In this way, the inspection device captures the electrical characteristics of the object 2 to be inspected, thereby performing the electrical inspection on the object 2 to be inspected.

The object 2 to be inspected, which is a target of inspection, is placed on an upper surface of a chuck top 5. The position of the chuck top 5 can be adjusted in the horizontal X-axis direction, in the Y-axis direction perpendicular to the X-axis direction on a horizontal plane, and in the Z-axis direction perpendicular to the horizontal plane (X-Y plane), and the rotational posture of the chuck top 5 can be adjusted in a θ-axis direction around the Z-axis. When performing electrical inspection on the object 2 to be inspected, the chuck that can be raised and lowered in the vertical direction (in the Z-axis direction) is moved, so that the electrode terminals 51 of the object 2 to be inspected come into electrical contact with the tips of the respective electrical contactors 3 on the probe substrate 43. Thus, the lower surface of the probe substrate 43 in the electrical connecting apparatus 1 and the object 2 to be inspected on the chuck top 5 are moved so as to be relatively close to each other,

[Support Member]

The support member 44 is to suppress the deformation (for example, bending or the like) of the wiring board 41. For example, since a number of electrical contactors 3 are attached to the probe substrate 43, the weight of the probe substrate 43 installed onto the wiring board 41 side becomes great. When performing the electrical inspection on the object 2 to be inspected, the object 2 to be inspected on the chuck top 5 is pressed against the probe substrate 43, so that the tips of the probes 20 and the electrode terminals 51 on the object 2 to be inspected are in electrical contact with each other. In this way, during the electrical inspection, a reaction force (contact load) is applied to thrust upward from the bottom, whereby a large load is also applied onto the wiring board 41, which can cause the wiring board 41 to deform (for example, bend or the like). The support member 44 functions as a member that suppresses such deformation (for example, bending or the like) of the wiring board 14.

[Wiring Board]

The wiring board 41 is formed from a resin material, such as polyimide, for example, and is a printed circuit board or the like formed in a substantially circular-plate shape, for example. A number of electrode terminals (not shown) electrically connected to the test head (not shown) of the inspection device are disposed at a circumferential edge portion of an upper surface of the wiring board 41. Further, a wiring pattern (not shown) is formed on a lower surface of the wiring board 41, so that the connection terminals of the wiring pattern are electrically connected to upper ends of the plurality of connectors (not shown) provided in the electrical connection unit 42.

The wiring board 41 can have various configurations, and can have, for example, the following configuration. For example, the electrode terminals electrically connected to the test head are formed on the upper surface of the wiring board 41, while the wiring pattern electrically connected to each connector of the electrical connection unit 42 is formed on the lower surface of the wiring board 41, Further, a wiring circuit is formed inside the wiring board 41. The wiring pattern on the lower surface of the wiring board 41 and the electrode terminals on the upper surface of the wiring board 41 can be connected via the wiring circuit inside the wiring board 41. Therefore, the electrical signal can be conducted between each connector of the electrical connection unit 42 and the test head through the wiring circuit within the wiring board 41. It is noted that a plurality of electronic components required for the electrical inspection of the object 2 to be inspected are also disposed on the upper surface of the wiring board 41.

[Electrical Connection Unit]

The electrical connection unit 42 has a plurality of connectors, such as pogo pins, for example. In the assembled state of the electrical connecting apparatus 1, the upper end of each connector is electrically connected to the connection terminal of the wiring pattern on the lower surface of the wiring board 41, while the lower end of each connector is connected to each pad provided on the upper surface of the probe substrate 43. Since the tip of the electrical contactor is in electrical contact with the electrode terminal of the object 2 to be inspected, the electrode terminal 51 of the object 2 to be inspected is electrically connected to the inspection device through the electrical contactors 3 and the connectors, thus enabling the electrical inspection using the inspection device.

[Probe Substrate]

Figure 1:
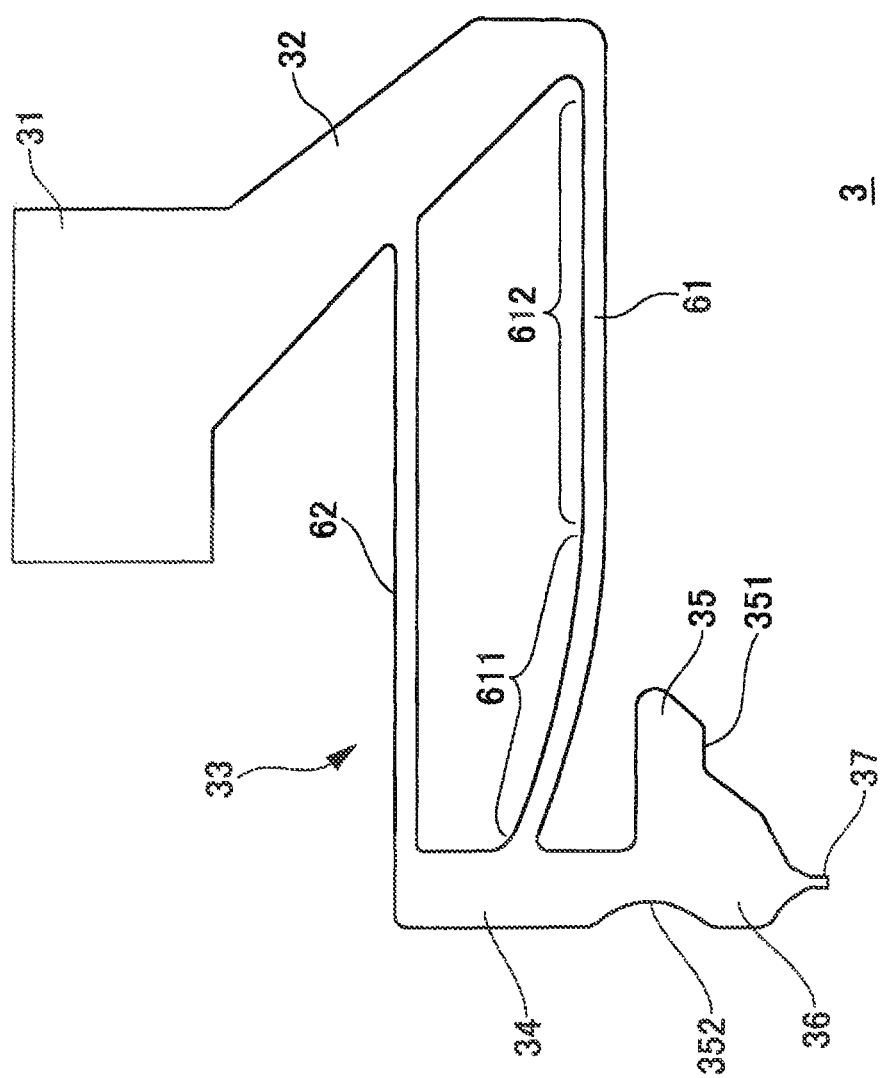
FIG. 1 is a configuration diagram showing a configuration of an electrical contactor according to an embodiment.

The probe substrate 43 is a substrate having a plurality of electrical contactors 3, and is formed in a substantially circular or polygonal shape (for example, a hexadecagonal shape or the like). When the probe substrate 43 is attached to the electrical connecting apparatus 1, the probe substrate 43 has its circumferential edge portion supported by a probe substrate supporting portion 18. The electrical contactor 3 incorporated in the probe substrate 43 may use, for example, a cantilever probe, but is not limited thereto. The electrical contactors 3, the number of which depends on the number of objects 2 to be inspected (semiconductor integrated circuits), the number of the electrode terminals 51 of each object 2 to be inspected, or the like, are incorporated in the probe substrate 43, The probe substrate 43 can have various configurations. FIG. 1 shows one example of this. For example, the probe substrate 43 has a substrate member 431 formed by a ceramic plate, for example, and a multilayer wiring board 432 formed on the lower surface of the substrate member 431.

A number of conductive paths (not shown) that penetrate in the direction of the plate thickness may be formed inside the substrate member 431, which is a ceramic substrate. Pads are formed on the upper surface of the substrate member 431, which is formed so that one end of the conductive path in the substrate member 431 is connected to the connection terminal of the corresponding wiring pattern on the upper surface of the substrate member 431. The lower surface of the substrate member 431 is formed so that the other end of the conductive path in the substrate member 431 is connected to the connection terminal provided on the upper surface of the multilayer wiring board 432.

The multilayer wiring board 432 is formed by a plurality of multilayer boards formed by synthetic resin members made of, for example, polyimide or the like, and wiring paths (not shown) may be formed between the plurality of multilayer boards. One end of the wiring path in the multilayer wiring board 432 is connected to the other end of the conductive path of the substrate member 431, while the other end of the multilayer wiring board 432 is connected to the probe land provided on the lower surface of the multilayer wiring board 432. A plurality of electrical contactors 3 are disposed in probe lands provided on the lower surface of the multilayer wiring board 432, and the plurality of electrical contactors 3 of the probe substrate 43 are electrically connected to the corresponding connection terminals of the wiring board 41 via the electrical connection unit 42.

(A-1-2) Electrical Contactor

FIG. 1 is a configuration diagram showing a configuration of the electrical contactor according to the embodiment. In FIG. 1, the electrical contactor 3 has an installing portion 31, a base end portion 32, an arm portion 33, a coupling portion 34, a positioning portion 35, a pedestal portion 36, and a contact portion 37.

The electrical contactor 3 is formed by a plate-shaped conductive member (for example, metal material) and conducts an electrical signal between the electrode terminal 51 of the object 2 to be inspected as a first contact target and a wiring terminal 433 (see FIG. 4 and the like) of the probe substrate 43 as a second contact target. For example, the electrical contactor 3 can be formed by plating or the like. The electrical contactors are formed with the same thickness or the same level of thickness as the whole.

The dimensions of the electrical contactor 3 are not particularly limited because they are determined depending on the size of the electrode terminal 51 of the object 2 to be inspected, the interval between the electrode terminals 51, and the like. However, the dimensions (length) of the electrical contactor 3 in the left and right directions can be, for example, approximately several millimeters.

The electrical contactor 3 is a cantilever-type contactor in which the arm portion 33 coupled to the base end portion 32 side is elastically deformed by the application of the contact load from the electrode terminal 51 side toward the contact portion 37 side when the electrode terminal 51 of the object 2 to be inspected and the contact portion 37 are in electrical contact with each other, thus causing the arm portion 33 to elastically support the contact portion 37. Thus, the contact portion 37 and the electrode terminal 51 can surely come into electrical contact with each other while suppressing the contact load between the contact portion 37 and the electrode terminal 51.

[Installing Portion]

The installing portion 31 is a portion installed onto the lower surface of the probe substrate 43 and is in electrical contact with the wiring terminal 433 of the probe substrate 43. In FIG. 1, a case where the installing portion 31 has a rectangular shape is illustrated, but the shape of the installing portion 31 may be changed according to the method of installing the electrical contactor 3 onto the probe substrate 43. Alternatively, necessary elements for installation onto the probe substrate 43 may be provided, for example, by providing one or a plurality of holes in the installing portion 31 or the like. The base end portion 32 is integrally formed with the lower portion of the installing portion 31.

[Ease End Portion]

The base end portion 32 is a portion extending downward from the lower portion of the installing portion 31. The base end portion 32 is a portion that is coupled to a rear end of the arm portion 33 (the right end of the arm portion 33 in FIG. 1) to thereby support the elastically deformable arm portion 33. It is noted that in FIG. 1, the base end portion 32 extends from the lower portion of the installing portion 31 diagonally rightward and downward. This is because the length of the elastic arm portion 33 in the left and right directions is shortened as the diameter of the electrode terminal 51 of the object 2 to be inspected becomes smaller or as the pitch between the electrode terminals becomes narrower, or the like, which makes it difficult to bend the arm portion 33 and to control the amount of movement of the contact portion 37. Therefore, by slightly extending the base end portion 32 diagonally rightward and downward with respect to the installing portion 31, the length of the arm portion 33 in the left and right direction can be ensured to some extent, thereby enabling the elasticity of the arm portion 33 to effectively act to control the amount of movement of the contact portion 37.

[Arm Portion]

The arm portion 33 is a portion elastically supporting the contact portion 37. The arm portion 33 is a portion adjusting the amount of movement and the amount of scrubbing of the contact portion 37. FIG. 1 illustrates a case where the arm portion 33 has a first arm portion 61 and a second arm portion 62. In addition, a case where the lengths of the first arm portion 61 and the second arm portion 62 in the vertical direction are the same is illustrated. In other words, a case where the arm portion 33 is composed of two arm portions is illustrated.

The first arm portion 61 and the second arm portion are provided to be spaced apart from each other in the vertical direction. The rear ends (the right ends in FIG. 1) of the first arm portion 61 and the second arm portion 62 are integrally coupled to the base end portion 32, while the tips (the left ends in FIG. 1) of the first arm portion 61 and the second arm portion 62 are integrally coupled to the coupling portion 34.

The first arm portion 61 is the member of the two arm portions that is provided on the contact portion 37 side (i.e., the side of the object 2 to be inspected). The first arm portion 61 is the member of a plurality of arm portions that is provided the closest to the contact portion 37. Hereinafter, the first arm portion 61 is also referred to as the closest-to-contact-portion arm portion, the lowermost arm portion, or the like.

The first arm portion 61 extending in the left and right directions has a straight portion 612 extending linearly from the base end portion 32 in the left direction and a curved portion 611 curved from the straight portion 612 diagonally leftward and upward. In an example of FIG. 1, the curved portion 611 is a portion convexly curved downward.

The straight portion 612 of the first arm portion 61 has a function of ensuring positioning of the contact portion 37 with respect to the electrode terminal 51 of the object 2 to be inspected. When the contact portion 37 comes into contact with the electrode terminal 51 of the object 2 to be inspected, the upward load is applied to the first arm portion 61, causing stress to be applied to the first arm portion 61. In particular, the straight portion 612 coupled to the base end portion 32 is spaced apart from the contact portion 37 and thus a large stress is applied thereto.

The curved portion 611 of the first arm portion 61 has a function of adjusting the amount of movement, the amount of scrubbing, the needle pressure, and the like of the contact portion 37 when the contact portion 37 and the electrode terminal 51 are in electrical contact with each other.

In a conventional cantilever probe having a plurality of arm portions, the arm portion closest to the contact portion 37 side is formed linearly over an entire region in the left and right directions to ensure positioning of the contact portion 37. In contrast, the first arm portion 61 of this embodiment has a curved portion 611 which is a curved part on the coupling portion 34 side where the contact portion 37 is located. Thus, the first arm portion. 61 has the function of adjusting the amount of movement, the amount of scrubbing, the needle pressure, and the like of the contact portion 37. Hereinafter, a detailed description will be given on a setting method of the curved portion 611 of the first arm portion 61.

The second arm portion 62 is a member provided on the installing portion 31 side. In this embodiment, the second arm portion 62 is a member other than the first arm portion. 61 (the closest-to-contact-portion arm portion or the lowest arm portion) that is closest to the contact portion 37.

Although in this embodiment, for ease of explanation, the second arm portion 62 is a straight member over the entire region in the left and right directions, the second arm portion 62 may have a curved portion. For example, the curved portion may be provided at one or more spots in various positions, such as a portion where the second arm portion 62 and the base end portion 32 are coupled together, the center part of the second arm portion 62, and a portion where the second arm portion 62 and the coupling portion 34 are coupled together. In this way, even when the second arm portion 62 has a curved portion, the function of adjusting the amount of movement, the amount of scrubbing, the needle pressure, and the like of the contact portion 37 can be achieved. In other words, in addition to the curved portion 611 of the first arm 61, the curved portion of the second arm portion 62 has a synergistic effect in adjusting the amount of movement, the amount of scrubbing, the needle pressure, and the like of the contact portion 37. However, in this embodiment, the second arm portion 62 is a straight member for ease of explanation

[Coupling Portion]

The coupling portion 34 is a portion integrally coupled to the tips of the arm portions 33 (i.e., the first arm portion 61 and the second arm portion 62). The coupling portion 34 is a member extending in the vertical direction and is a portion formed substantially in a rectangular shape.

[Positioning Portion]

The positioning portion 35 is a portion integrally coupled to the lower portion of the coupling portion 34 and extending from the lower portion toward the base end portion 32 side (in the right direction). A lower surface portion 351 of the positioning portion 35 is formed linearly in the left and right directions. The positioning portion 35 is a portion for positioning the contact portion 37 with respect to the electrode terminal 51 of the object 2 to be inspected. In particular, the lower surface portion 351 of the positioning portion 35 is formed linearly in the left and right directions, thereby surely enabling the positioning of the contact portion 37. As mentioned above, although the first arm portion 61 also has the function of positioning the contact portion 37, the first arm portion 61 extending in the left and right directions also has the curved portion 611 near the location where it is coupled to the coupling portion 34, and thus the positioning portion 35 that has the lower surface portion 351 formed linearly in the left and right directions is provided in order to more surely achieve the positioning of the contact portion 37.

In addition, a position confirmation portion 352 formed in an arc shape is provided at the tip of the positioning portion 35 (the left end in FIG. 1), and the most recessed portion of the arc shape is located at a position that corresponds to the position of the contact portion 37 provided in the lower portion of the pedestal portion 36. Thus, the contact portion 37 can be caused to come into electrical contact with the electrode terminal 51 of the object 2 to be inspected, while confirming the position of the contact portion 37.

[Pedestal Portion, Contact Portion]

The pedestal portion 36 is a portion extending downward from the lower portion of the positioning portion 35. The contact portion 37 is a portion provided in the lower portion of the pedestal portion 36 and that comes into electrical contact with the electrode terminal 51 of the object 2 to be inspected.

[Setting Method of Curved Portion of First Arm Portion]

Next, the concept of the setting method of the curved portion 611 of the first arm portion 61 will be described with reference to the drawings.

Figure 3:
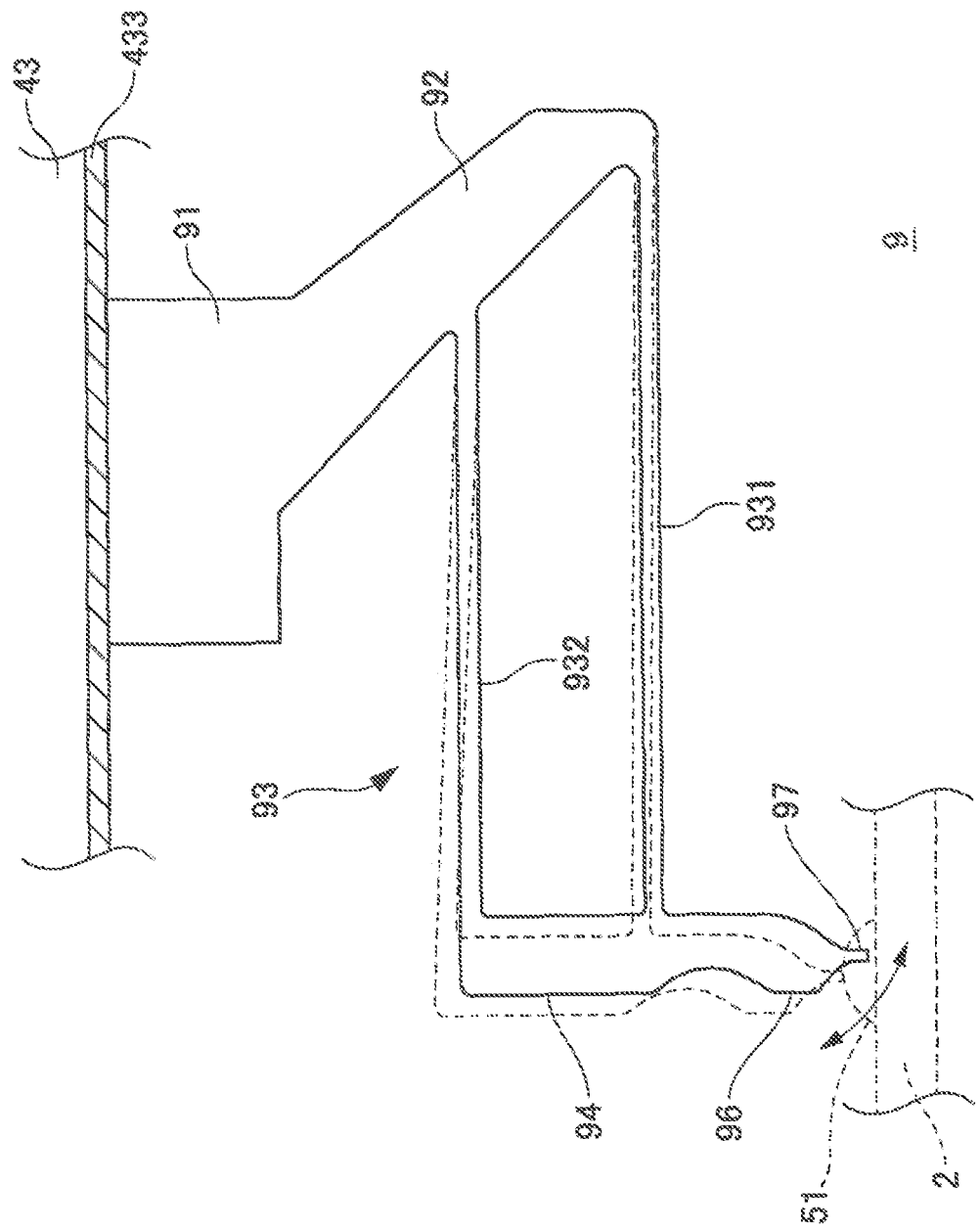
FIG. 3 is a configuration diagram showing a configuration of a conventional electrical contactor having a straight arm portion.

FIG. 3 is a configuration diagram showing a configuration of a conventional electrical contactor 9 having a straight arm portion (a closest-to-contact-portion arm portion). The dotted line in FIG. 3 shows a state in which an electrode terminal 51 of an object 2 to be inspected is in electrical contact with a contact portion 97 of the electrical contactor 9.

Figure 4:
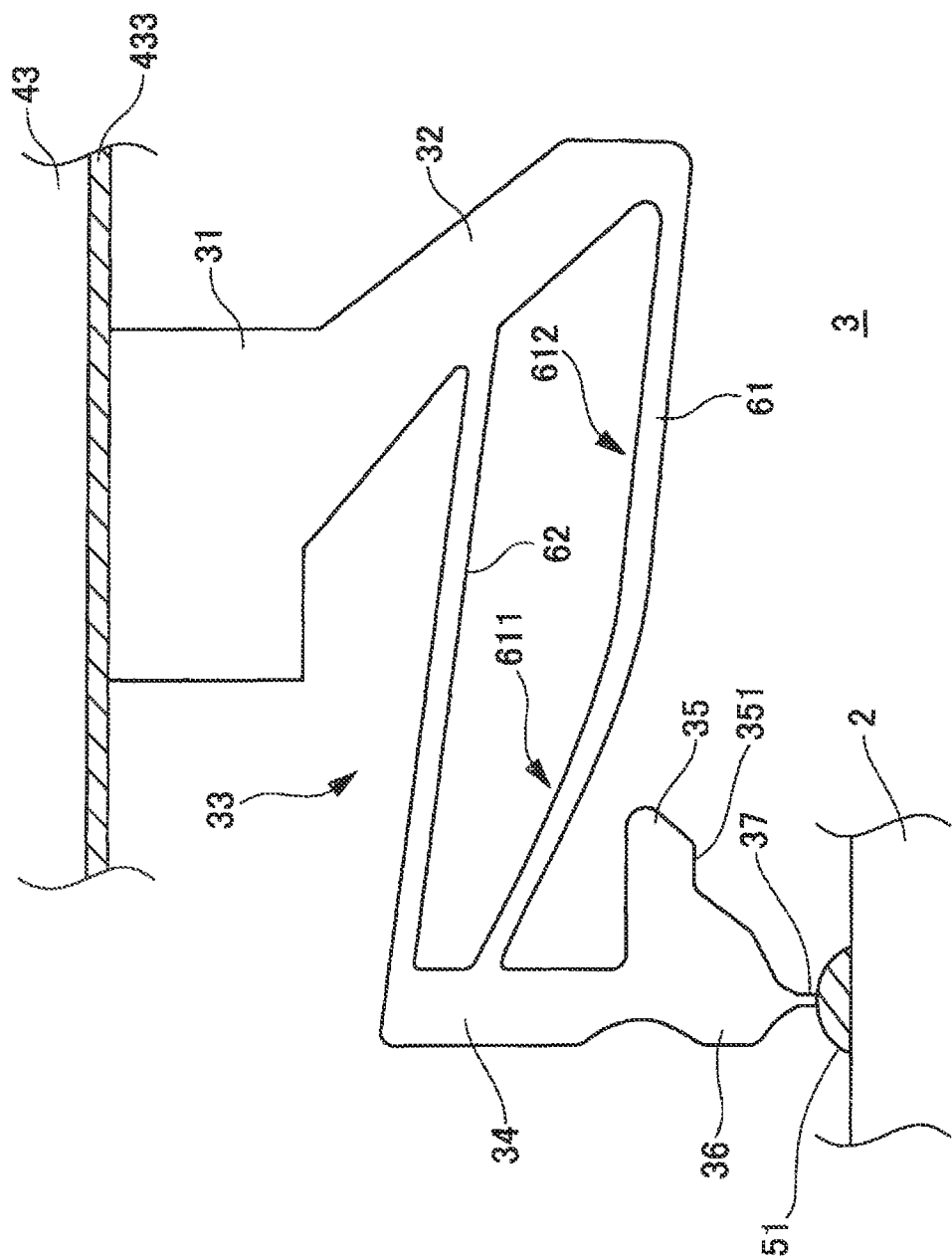
FIG. 4 is a diagram showing a state in which a contact portion of the electrical contactor of the embodiment and an electrode terminal of an object to be inspected are in electrical contact with each other.

FIG. 4 is a diagram showing a state in which a contact portion 37 of the electrical contactor 3 of the embodiment and the electrode terminal 51 of the object 2 to be inspected are in electrical contact with each other;

The conventional electrical contactor 9 illustrated in FIG. 3 basically includes the components corresponding to those of the electrical contactor 3 of the embodiment, but includes two arm portions 93 (an upper arm portion 931 and a lower arm portion 932). The lower arm portion 932 is a member that linearly extends from a base end portion 92 in the left direction. The left end portion of the lower arm portion 932 is coupled to a coupling portion 94. In FIG. 3, the components corresponding to the positioning portion 35 of the electrical contactor 3 are omitted.

As shown in FIG. 3, the load is applied from the electrode terminal 51 toward the contact portion 97 when the contact portion 97 of the electrical contactor 9 and the electrical terminal 51 of the object 2 to be inspected come into electrical contact with each other. In such a case, the straight upper arm portion 931 supports the contact portion 97 in such a manner as to draw an arc around the base end portion 92 as the center, so that the contact portion 97 moves in the direction indicated by the arrow in FIG. 3. For example, when overdrive is applied, the contact portion 97 scrubs the surface of the electrode terminal 51. When the amount of movement and the amount of scrubbing of the contact portion 97 become significant in this way, the electrical contact between the contact portion 97 and the electrode terminal 51 cannot be ensured.

In contrast, as illustrated in FIG. 4, the first arm portion 61 of the electrical contactor 3 of the embodiment has a convex curved portion 611 at its lower portion. Thus, when the contact portion 37 and the electrode terminal 51 come into contact with each other, the load is applied in the reverse direction to the movement direction of the contact portion 37 (for example, the left direction in the case of FIG. 4) with respect to the electrode terminal 51, resulting in a reduced amount of movement of the contact portion 37. In other words, the first arm portion 61 has the curved portion 611, the contact portion 37 is lifted and moves upward, and thus the amount of movement of the contact portion 37 is reduced. It is obvious that even when the overdrive is applied, the amount of scrubbing of the contact portion 37 is also reduced. Since the first arm portion 61 has the curved portion 611, the needle pressure against the electrode terminal 51 is suppressed Furthermore, in order to improve the conduction characteristics of the electric signal flowing through the electrical contactor 3, the amount of movement and the amount of scrubbing of the contact portion 37 can be adjusted by the curved portion 611 of the first arm portion 61, even when the thickness (the length in the vertical direction; hereinafter also referred to as an "arm width") of the first arm portion 61 and/or second arm portion 62 is thickened. In other words, by adjusting the degree of curvature of the tip side of the first arm portion 61 and the thickness of the arm portion 33 (the first arm portion 61 and/or the second arm portion 62), it is possible to achieve both the adjustment of the amount of movement, the amount of scrubbing, the needle pressure, and the like of the contact portion 37, and the adjustment of the conductive characteristics of the electrical signal at the same time.

Figure 5:
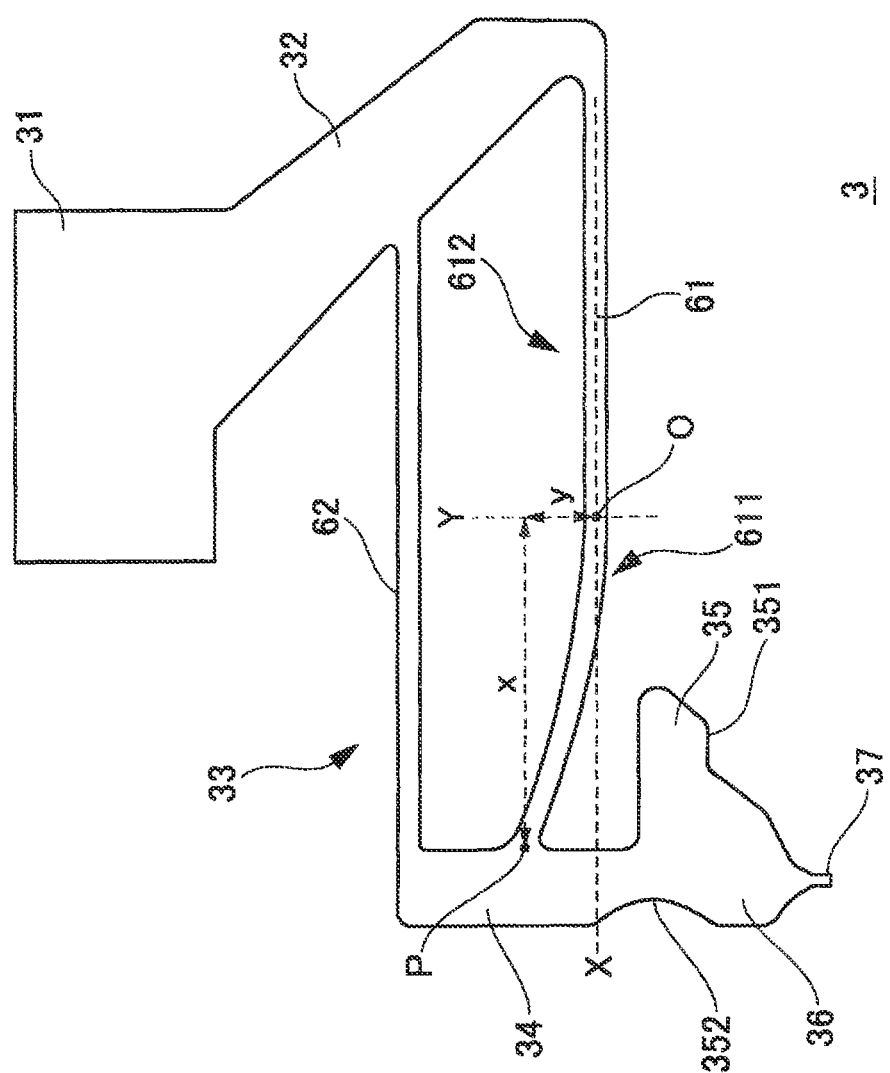
FIG. 5 is an explanatory diagram for explaining the concept of a method for setting a curved portion of a first arm portion in the electrical contactor according to the embodiment.

FIG. 5 is an explanatory diagram for explaining the concept of a method for setting the curved portion 611 of the first arm portion 61 in the electrical contactor 3 according to the embodiment.

In FIG. 5, a midpoint (a virtual point) of a boundary plane between a straight portion 612 and a curved portion 611 is referred to as "point O". The axial direction of the straight portion 612 through point O is referred to as the "X axis", and the straight line perpendicular to the X axis through point O on the plate surface (the plane) of the plate-shaped electric contactor 3 is referred to as the "Y axis".

When designing an electric contactor 3, it is very difficult to determine (to design) the curved shape of the curved portion 611 of the first arm portion 61 in consideration of the amount of movement, the amount of scrubbing, and the needle pressure of the contact portion 37, as well as the conduction characteristics and the like of the electric signal. This is because in order to improve the conductive characteristics of the electric signal, it is desirable to reduce the resistance value by increasing the thickness of the arm portion 33 (first arm portion 61 and/or the second arm portion 62), but the needle pressure becomes larger than a target value when the degree of reduction in the amount of movement and the amount of scrubbing of the contact portion 37 becomes small or the arm portion 33 is thickened, making it difficult to find out the optimal radius of the arc (the degree of curvature) of the curved portion 611. Since the thickness of the arm 33 and the radius of the arc of the curved portion 611 are designed in parallel, it is difficult to optimize the thickness and the radius of the arc.

Therefore, in this embodiment, the midpoint of the boundary plane between the first arm portion 61 and the coupling portion 34 is referred to as point P with respect to point O as reference, and the radius of the arc (the degree of curvature) of the curved portion 611 is determined by changing (x, y), which is a combination of a distance in the X-axis direction from point O to point P (an x distance, or also referred to as an x coordinate value) and a distance in the Y-axis direction from point O to point P (a y distance or also referred to as a y coordinate value).

Further, regarding the thickness (the arm width) of the first arm portion 61, (x, y) is appropriately designed for each thickness of the first arm portion 61 while changing its thickness, and thereby the optimal values of the thickness of the first arm portion 61 and the radius of the arc of the curved portion 611 are derived. It is noted that the size of the arm width of the second arm portion 62 can also affect the amount of movement, the amount of scrubbing, the needle pressure, the resistance value, and the like of the contact portion 37. Therefore, the size of the arm width of the first arm portion 61 may be changed after specifying not only the arm width of the first arm portion 61, but also the arm width of the second arm portion 62. Here, a case where the arm width of the second arm portion 62 is a constant value is exemplified.

More specifically, the arm width (the length in the vertical direction) of the entire area of the first arm portion 61 extending in the left and right directions is expressed by "a1". Then, for example, a combination of (x, y) of point P is set as (x1, y1), and then the curved portion 611 is designed based on the curved line with the curvature that connects point O and point p. In such a case, theoretical or measured values of the amount of movement, the amount of scrubbing, the needle pressure, the resistance value, and the like of the contact portion 37, are determined. Regarding the combination of (x, y) of point P, the combination of the x coordinate value (x distance) and the y coordinate value (y distance) is changed to (x1, y2), (x1, y3), etc., or (x2, y1), (x2, y2), (x2, y3), etc., or (x3, y1), (x3, y2), etc., and then theoretical or measured values of the amount of movement, the amount of scrubbing, the needle pressure, the resistance value, and the like of the contact portion 37 of these combinations are determined.

Next, the arm width is changed to "a2", and then the theoretical or measured values of the amount of movement, the amount of scrubbing, the needle pressure, the resistance value, and the like of the contact portion 37 are determined by changing the combination of (x, y) of point P in the same manner as the method mentioned above.

Such a procedure is carried out to adjust the degree of curvature of the curved portion 611 (i.e., the combination of the x distance and the y distance from point F) and the thickness of the first arm portion 61.

As mentioned above, the curved portion 611 of the first arm portion 61 can be easily designed by adjusting the combination of (x, y) of point P for each thickness of the first arm portion 61 while changing the thickness (the arm width) of the first arm portion 61. Meanwhile, the resistance value can be adjusted while changing the amount of movement, the amount of scrubbing, and the needle pressure of the contact portion 37.

Also, in the above-mentioned example, a case where the arm width is constant over the entire area of the first arm portion 61 is exemplified, but the arm width may vary depending on the position of a part of the first arm portion 61 extending in the left and right directions.

For example, when a load is applied to the first arm portion 61, the stress may be considered to reach a maximum at a position close to the base end portion 32 (the rear end of the first arm portion 61) in the first arm portion 61. Therefore, the first arm portion 61 may be designed such that the arm width of the rear end of the first arm portion 61 is relatively large, while the arm width of the tip of the first arm portion 61 is relatively small. In this way, the rear end of the first arm portion 61, onto which a large load is applied, can be reinforced. In particular, when the x distance of the curved portion 611 is increased, a large load is applied near a part where the first arm portion 61 and the base end portion 32 are coupled together, so that the base end portion 32 of the first arm portion 61 can be effectively reinforced.

(A-2) Modified Embodiment

In the above-mentioned embodiment, a case where the arm portion 33 is composed of the two arm portions is exemplified, but the arm portion 33 may have three or more arm portions.

Figure 6:
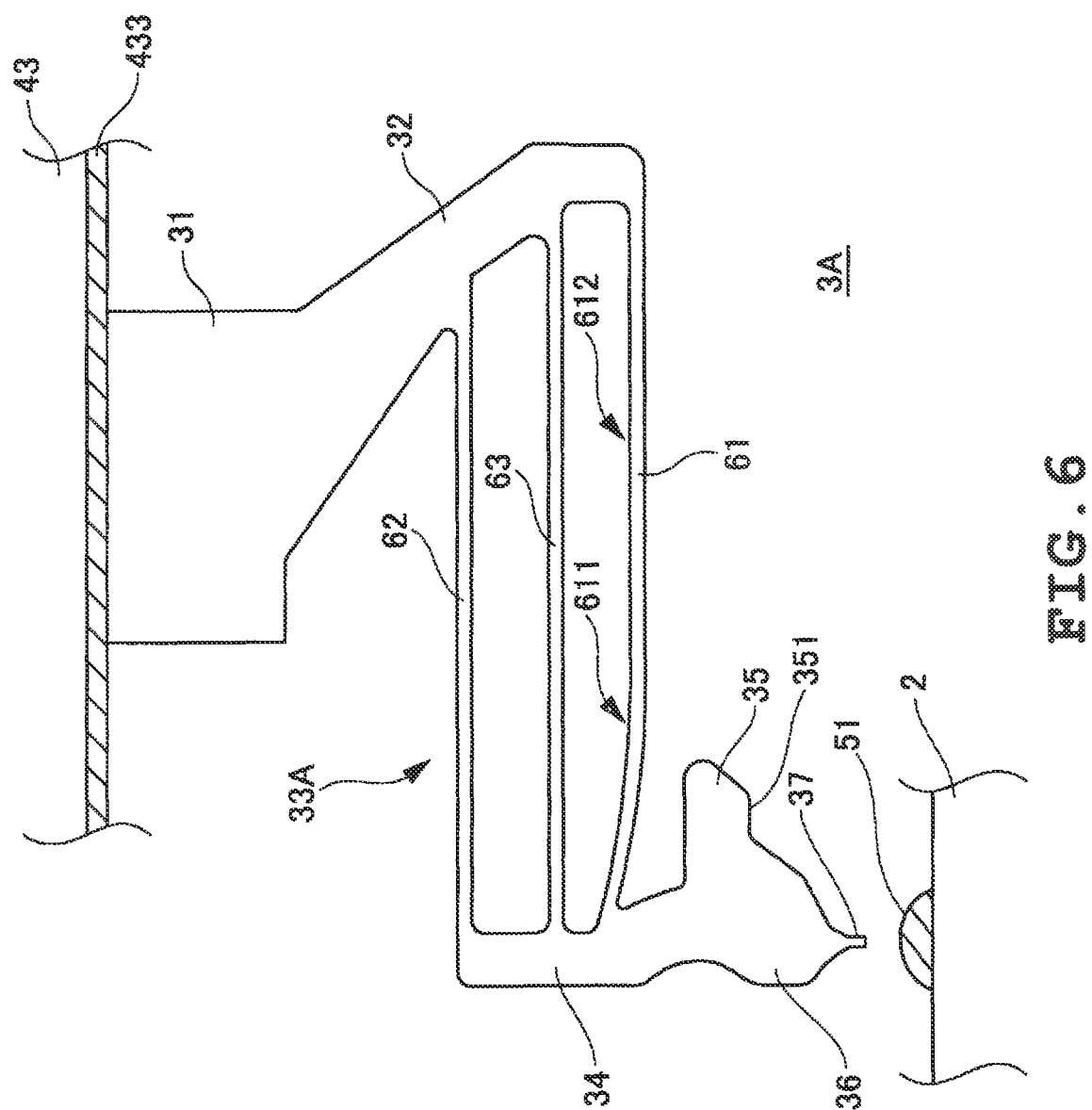
FIG. 6 is a configuration diagram showing a configuration of an electrical contactor according to a modified embodiment (Part 1)
Figure 7:
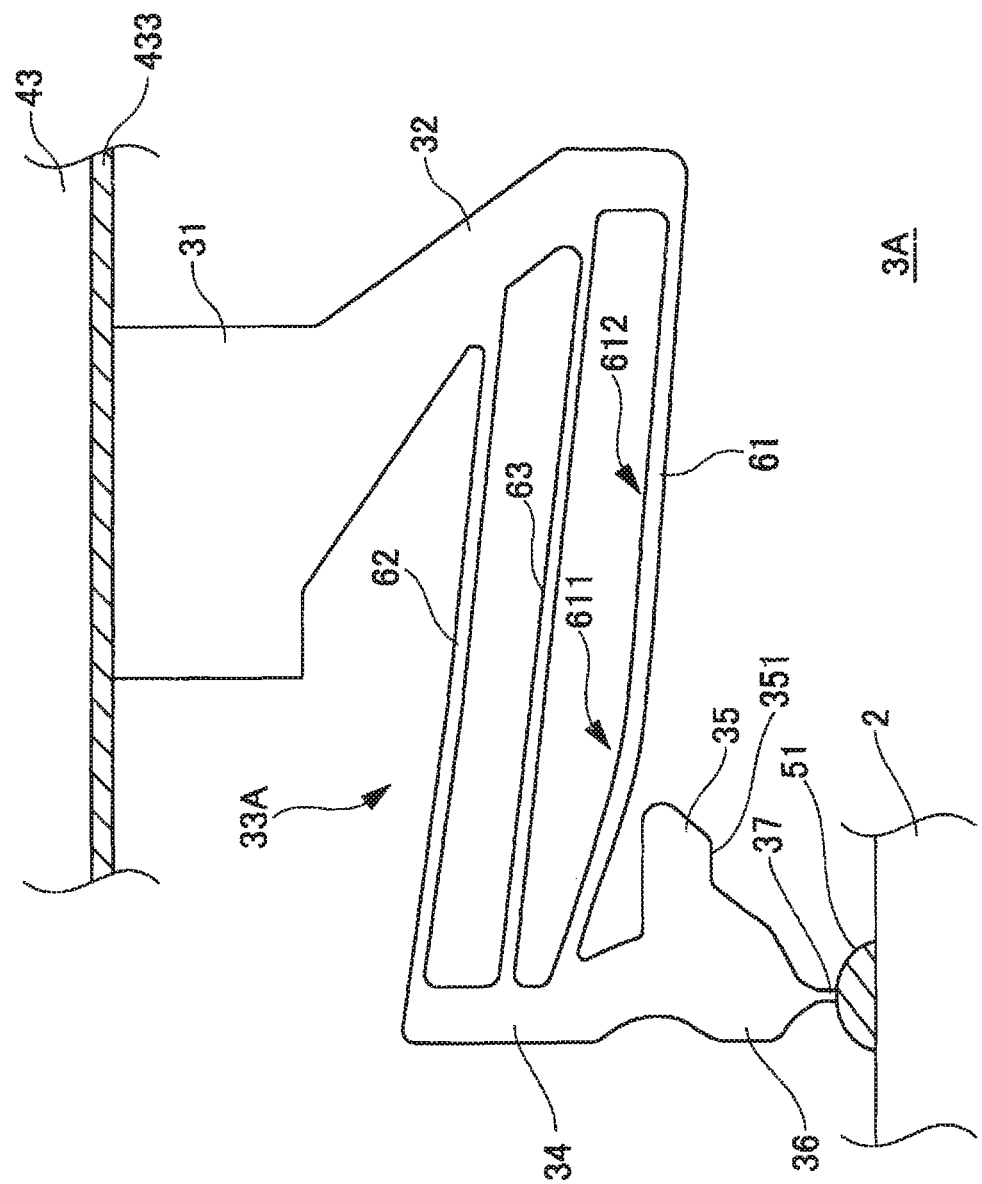
FIG. 7 is a diagram showing a state in which a contact portion of the electrical contactor of the modified embodiment and an electrode terminal of an object to be inspected are in electrical contact with each other.

FIG. 6 is a configuration diagram showing a configuration of an electrical contactor 3A according to a modified embodiment. FIG. 7 is a diagram showing a state in which a contact portion 37 of the electrical contactor 3A of the modified embodiment and an electrode terminal 51 of the object 2 to be inspected are in electrical contact with each other.

FIGS. 6 and 7 illustrate a case where the arm portion 33A of the electrical contactor 3A has a first arm portion 61, a second arm portion 62, and a third arm portion 63.

Although in FIG. 6, the second arm portion 62 and the third arm portion 63 are straight members over the entire region in the left and right directions, the second arm portion 62 and the third arm portion 63 may be provided with a portion curved in any position extending in the left and right directions.

In FIGS. 6 and 7, the first arm portion 61 is the closest-to-contact-portion arm portion. The first arm portion 61 has a straight portion 612 integrally coupled to the base end portion 32 and extending linearly in the left direction, and a curved portion 611 convexly curved downward and extending from the straight portion 612 diagonally leftward and upward.

In this case too, as shown in FIG. 7, since the first arm portion 61 has the curved portion 611, when the contact portion 37 and the electrode terminal 51 come into contact with each other, the load is applied in the reverse direction to the movement direction of the contact portion 37 with respect to the electrode terminal 51, resulting in a reduced amount of movement of the contact portion 37. Consequently, the contact portion 37 is lifted and moves upward, and thus the amount of movement of the contact portion 37 is reduced. The amount of scrubbing of the contact portion 37 is also reduced similarly to when the overdrive was applied. Since the first arm portion 61 has the curved portion 611, the needle pressure against the electrode terminal 51 is suppressed.

In a design method of the curved portion 611 of the first arm 61, similar to the design method mentioned above (see FIG. 5), the midpoint of the boundary plane between the first arm portion 61 and the coupling portion 34 is referred to as a point P with respect to point O as reference, and thereby the radius of an arc (the degree of curvature) of the curved portion 611 is determined by changing (x, y), which is a combination of an x distance and a y distance of point P. Thus, even when the arm portion 33A is composed of three or more arm portions, the combination of (x, y) of point P can be adjusted for each thickness of the first arm portion 61. Thus, the curved portion 611 of the first arm portion 61 can be easily designed, so that the resistance can be adjusted while adjusting the amount of movement, the amount of scrubbing, and the needle pressure of the contact portion 37.

(A-3) Effects of Embodiments

As mentioned above, according to this embodiment, there is provided the plate-shaped electrical contactor that has a plurality of arm portions extending from the base end portion in the left and right directions, wherein the curved portion is provided on the closest-to-contact-portion arm portion that is located on the contact portion side in electrical contact with the electrode terminal of the object to be inspected, among the plurality of arm portions, thereby making it possible to adjust (control) the amount of movement, the amount of scrubbing, and the needle pressure of the contact portion. Therefore, the amount of movement, the amount of scrubbing, and the needle pressure of the contact portion can be adjusted while reducing the resistance value by increasing the arm widths of the plurality of arm portions.

According to the present embodiment, the arc of the curved portion can be easily designed by adjusting the x distance and the y distance from the reference point which is the boundary between the straight portion and the curved portion at the closest-to-contact-portion arm portion.

(B) Other Embodiments

Although various modified embodiments have been described in the above-mentioned embodiments, the present disclosure can also be applied to the following modified embodiments.

(B-1) The above-mentioned embodiment has exemplified a case where the straight portion 612 is provided on the base end portion 32 side of the first arm portion 61, while the curved portion 611 is provided on the contact portion 37 side.

However, the embodiment is not limited to this, and for example, as shown in FIG. 8, a curved portion 611B may be provided on the base end portion 32 side of the first arm portion (closest-to-contact-portion arm portion) 61B, while a straight portion 612B may be provided on the contact portion 37 side thereof.

Also in this case, since the curved portion 611 is provided on the base end portion 32 side of the first arm portion 61E, when the contact portion 37 and the electrode terminal 51 come into contact with each other, the load is applied in the reverse direction to the movement direction of the contact portion 37 with respect to the electrode terminal 51, thereby making it possible to adjust the amount of movement and the amount of scrubbing of the contact portion 37 and the needle pressure of the contact portion 37 against the electrode terminal 51.

REFERENCE SIGNS LIST

3, 3A and 3B . . . electrical contactor, 31 . . . installing portion, 32 . . . base end portion, 33, 33A, and 33B . . . arm portion, 61 and 61B . . . first arm portion, 611 and 611 . . . curved portion, 612 and 612B . . . straight portion, 62 . . . second arm portion, 34 . . . coupling portion, 35 . . . positioning portion, 351 . . . lower surface portion, 352 . . . position confirmation portion, 36 . . . pedestal portion, 37 . . . contact portion, 1 . . . electrical connecting apparatus, 41 . . . wiring board, 42 . . . electrical connection unit, 43 . . . probe substrate, 431 . . . substrate member, 432 . . . multilayer wiring board, 44 . . . support member, 2 . . . object to be inspected, 51 . . . electrode terminal

The invention claimed is:

1. An electrical contactor comprising: an installing portion; a base end portion extending continuously toward the installing portion; a plurality of arm portions extending from the base end portion in a longitudinal direction; a coupling portion coupled to the tip of each of the arm portions; a pedestal portion provided continuously toward the coupling portion; and a contact portion provided at a lower end of the pedestal portion, wherein each of the plurality of arm portions elastically supports the contact portion in contact with a first contact target, and wherein a closest-to-contact-portion arm portion that is the closest to the contact portion among the plurality of arm portions comprises a straight portion supported by the base end portion and extending linearly in the longitudinal direction, and a curved portion integrally formed with the straight portion and provided between the straight portion and the coupling portion, the curved portion suppressing an amount of movement of the contact portion, and wherein the pedestal portion comprises a positioning portion for positioning the contact portion in contact with the first contact target, the pedestal portion extending linearly in the longitudinal direction between the contact portion and the closest-to-contact-portion arm portion, the positioning portion having a surface parallel to the straight portion of the closest-to-contact-portion.

2. The electrical contactor according to claim 1, wherein a curved shape of the curved portion is formed based on a first distance from a reference point in the longitudinal direction at a boundary between the curved portion and the straight portion of the closest-to-contact-portion arm portion and a second distance from the reference point in a direction perpendicular to the longitudinal direction on a plane of a main body of the electrical contactor.

3. An electrical connecting apparatus, comprising: a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to claim 2.

4. The electrical contactor according to claim 1, wherein the pedestal portion is provided with a position confirmation portion for confirming a position of the contact portion, at a position opposed to the positioning portion.

5. An electrical connecting apparatus, comprising: a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to claim 4.

6. An electrical connecting apparatus, comprising: a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to claim 1.

\* \* \* \* \*